United States Patent
Zheng et al.

[11] Patent Number: 6,046,948
[45] Date of Patent: Apr. 4, 2000

[54] LOW WORD LINE TO BIT LINE SHORT CIRCUIT STANDBY CURRENT SEMICONDUCTOR MEMORY

[75] Inventors: Hua Zheng, Fremont; Yuan-Mou Su, Cupertino, both of Calif.

[73] Assignee: Winbond Electronics Corporation America, San Jose, Calif.

[21] Appl. No.: 09/114,600

[22] Filed: Jul. 14, 1998

[51] Int. Cl.[7] .................................................. G11C 13/00
[52] U.S. Cl. ................ 365/203; 365/189.01; 365/230.01
[58] Field of Search ............................... 365/203, 189.01, 365/230.01

[56] References Cited

U.S. PATENT DOCUMENTS 5,661,417   8/1997   Kondoh .................................... 365/203

*Primary Examiner*—Terrell W. Fears
*Attorney, Agent, or Firm*—Proskauer Rose LLP

[57] ABSTRACT

A precharge circuit is operable during a standby mode to drive a word line to a low voltage level and one or more (pairs of) bit lines to a standby voltage level. The precharge circuit comprises a driver for driving the on or more bit lines to the stand by voltage level. The precharge circuit also includes a control circuit connected to a control input of the driver which control circuit receives the standby signal. The control circuit outputs a varying enable signal to the driver for varying the drive of the bit lines by the driver. The precharge circuit can include a first current limiting driver for driving the bit lines to the standby voltage level, and second driver, for driving the bit lines to the standby voltage level. The second driver has a greater switching speed, and a higher current driving capacity, than the first current limiting driver. Tie control circuit enables the second driver for a certain period of time in response to detecting an indication of a beginning of the standby mode of the standby signal.

10 Claims, 2 Drawing Sheets

LOW WORD LINE TO BIT LINE SHORT CIRCUIT STANDBY CURRENT SEMICONDUCTOR MEMORY

FIELD OF THE INVENTION

The present invention pertains to semiconductor memory integrated circuits (ICs), such as DRAMs. In particular, the present invention pertains to reducing the power consumption during standby mode of a DRAM with a word line to bit line short circuit.

BACKGROUND OF THE INVENTION

A semiconductor memory IC, such as a DRAM, includes an array of memory cells organized into rows and columns. Bit lines are provided for each column of memory cells, and each memory cell is connected to the bit lines corresponding to the column in which the memory cell is located. Likewise, word lines are provided for each row of memory cells, and each memory cell is connected to the word line corresponding to the row in which the memory cell is located.

FIG. 1 shows a portion of a conventional DRAM 10. A single memory cell is shown formed from a MOSFET 22 having its source connected to a capacitor 24. The gate of the MOSFET 22 is connected to a word line (WL) 42 of the row in which the cell 20 is located and the drain of the MOSFET is connected to a bit line (BL) 32 of the column in which the cell 20 is located. Also provided for the column in which the cell is located is a complementary bit line (BL') 24. A row decoder 44 is connected to the word line 42.

Also connected to the word line 42 and bit lines 32, 34 is a precharge circuit 50. The precharge circuit 50 includes an inverter 51 receiving a signal EQ at its input. The output of the inverter 51 is connected to the word line 42. Also provided is a voltage source 53 having a voltage level of $V_{DD}/2$ where $V_{DD}$ is the voltage level of the high voltage power supply bus. Connected to the voltage source 53 is a current limiting current source 55 formed as an NMOSFET 55 with a long channel length L. The current outputted by the current source 55 is provided to the sources of switch NMOSFETs 56 and 57. Each switch NMOSFET 56 and 57 receives the signal EQ at its gate. The drain of NMOSFET 56 is connected to the bit line 32 and the drain of NMOSFET 57 is connected to the complementary line 34. Connected across the pair of bit lines 32, 34 is an equalizing NMOSFET 58. The gate of NMOSFET 58 also receives the signal EQ.

The operation of the DRAM 10 has two modes, namely, a standby mode, and an access mode. During the standby mode, no cells of the memory array are accessed. Rather, the DRAM 10 places the bit line pair 32, 34, and the word lines, e.g., word line 42, into a state that enables quick access the access mode is initiated. To that end, the signal EQ is set to the high voltage level $V_{DD}$. This causes the inverter 51 to drive the word lines, including word line 42, to the low voltage level $V_{SS}$ of the low voltage power supply bus. Meanwhile, MOSFETs 56 and 57 turn on. "Long L" current driver 55, which is permanently turned on by virtue of having its gate connected to the high voltage power supply bus, drives the bit line pairs to which it is connected, including bit line pair 32, 34, to the standby voltage level of one half of the high voltage level, i.e., the voltage level $V_{DD}/2$ of the voltage source 53 connected thereto. NMOSFET 58 attempts to evenly distribute the supplied current across the bit line 32 and the complement bit line 34 so that they charge to approximately the same level.

During the access mode, the signal EQ is set to the low voltage level $V_{SS}$. Inverter 51 is only enabled when the signal E is the high voltage level $V_{DD}$ and therefore does not drive the word line 42 to any voltage level. A unique address of the cell 20 is externally supplied which is divided into a row address, indicating the word line connected to the cell 20, and a column address, indicating the bit line pair connected to the cell 20. The row decoder 44 receives the row address and activates the appropriate word line, e.g., the word line 42, indicated by the row address. Likewise, a column decoder (not shown) activates the bit line pair, e.g., the bit line pair 32, 34, indicated by the column address. In the case of a read operation, this is achieved by driving the activated word line 42 to the high voltage level $V_{DD}$ and monitoring the differential voltage outputted on the activated bit line pair 32, 34. During the read operation, the cell 20 changes the voltage of the bit line 32 in a particular way relative to a charge stored on its capacitor 24 (if any). If the voltage of the bit line 32 drops, a logic '0' is detected. If the voltage on the bit line 32 increases, a logic '1' is detected. A sense amplifier (not shown) connected to the bit line pair 32, 34 amplifies the differential voltage of the bit line pair 32, 34 and outputs this differential voltage as the logic value read from the cell 20. During a write operation, a sense amplifier changes the relative voltages of the bit line pair 32, 34 so as to store a particular charge on the capacitor 24 that may be read out later.

DRAMs are fabricated in batches. Typically, a certain number of the fabricated DRAMs are defective. Defects most commonly occur in the memory array, where the geometrical features of the word lines 42, bit line pairs 32,34, and cell components 22 and 24 are minimized to increase the 20 storage capacity of the DRAM 10. Often, a DRAM 10 is provided with redundant "repair" rows and or columns of cells. The redundant rows and/or columns of cells have their own word lines and bit line pairs. A redundant row or column may be substituted for a defective row or column by testing the DRAM to identify a defective row or column and blowing one or more fuses for causing the DRAM row or column decoder to access the redundant row or column in place of the defective row or column, when an attempt is made to access a cell in the defective row or column.

In an attempt to conserve IC layout space, the DRAM 10 is provided with fewer precharge circuits 50 than word lines or column lines. For example, as shown in FIG. 2, in a 64 Mbit DRAM, 64 blocks of memory cell may be provided, wherein each block has 1,024 pairs of bit lines 32, 34. One precharge circuit 50 may be provided for each block which precharges 1,024 bit line pairs 32, 34. Referring again to FIG. 1, assume that there is a defect in the particular pair of bit lines 32, 34, namely, a short circuit 60 from the bit line 32 to the word line 42. This pair of bit lines 32, 34 will be replaced by a redundant repair column. Nevertheless, the defective bit line pair 32, 34 is still driven by the same precharge circuit 50 during standby mode.

Such a short circuit 60 can alone draw a current in excess of 75 $\mu$A from the source 53. This is because the source 53 is attempting to drive the bit line 32 to the voltage $V_{DD}/2$ while the short circuit 60 provides a conduction path to the word line 42 which the inverter 51 has driven to the low voltage level of $V_{SS}$. Approximately 50 $\mu$A may be needed during standby mode to drive the bit line pairs of the memory array assuming no short circuits. A low power specification exists for DRAMs used in portable devices such as laptop computers, cellular phones, etc. which specifies that no more than about 150–200 $\mu$A can be drawn by a low power DRAM during standby mode. Therefore, if the DRAM 10 has two snort circuits 60, the total power consumption of the DRAM 10 may cause the DRAM 10 to fail the current consumption requirement of the low power specification.

To remedy this problem, conventional DRAM architectures 10 utilize a "long L" current source 55. As noted above, the long L current source 55 is so called because it has a long channel length. This causes the current source 55 to be resistive and to function as a current limiting current source. With the channel of the long L current source 55 set to a sufficient length, the current draw of the short circuit 60 can be limited to no more than 75 $\mu$A. Thus, the DRAM 10 can have two short circuits and still remain within the standby current consumption requirements of the low power specification.

The use of a long NMOSFET 55 is not without penalty. A long L NMOSFET 55 takes a longer time to charge up each bit line pair to which it is connected to $V_{DD}/2$. Recall, this is a necessary step prior to accessing the cells. In fact, the selection of channel length L of the NMOSFET 55 to limit short circuit current draw to 75 $\mu$A is made as a tradeoff between limiting the short circuit current draw and minimizing the standby mode time. In addition, extra space is occupied by the larger NMOSFET 55 in the DRAM IC layout.

It is an object of the present invention to overcome the disadvantages of the prior art.

It is also an object of the present invention to improve the yield of DRAMs.

SUMMARY OF THE INVENTION

These and other objects are achieved according to the present invention. According to one embodiment, a precharge circuit is provided which is operable during a standby mode to drive one or more word lines to a low voltage level and one or more (pairs of) bit lines to a standby voltage level. The precharge circuit comprises a driver for driving the one or more bit lines to the stand by voltage level. The precharge circuit also includes a control circuit connected to a control input of the driver which control circuit receives the standby signal. The control circuit outputs a varying enable signal to the drive for varying the drive of the bit lines by the driver.

According to yet another embodiment, the precharge circuit comprises a first current limiting driver for driving the bit lines to the standby voltage level. A second driver is also provided for driving the bit lines to the standby voltage level. The second driver has a greater switching speed, and a higher current driving capacity, than the first current limiting driver. A control circuit is furthermore connected to a control input of the second driver and receives a standby signal. The control circuit enables the second driver for a certain period of time in response to detecting an indication of a beginning of the standby mode of the standby signal.

Thus, the first driver can be a "long L" driver and the second driver can be a "short L" driver, i.e., a short channel length driver. The long L driver can be made longer than in a conventional DRAM without affecting the minimum standby mode speed. This is because the short L driver is used initially to quickly charge up the bit lines. The long L driver simply maintains the voltage of the bit lines using a limiter current draw. To limit short circuit current draw, the high current driving capacity "short L" driver is only turned on for the certain period of time when the standby mode begins and is turned off for the remaining duration of standby mode.

According to yet another embodiment, the precharge circuit comprises a driver for driving the bit lines to the standby voltage level. The precharge circuit also has a control circuit connected to a control input of the driver and receiving a standby signal. A fuse is furthermore provided and is connected to the control circuit. The fuse is either in a first state or a second state which states correspond to the fuse being blown or intact (i.e., the first state can be the blown state and the second state can be the intact state or the first state can be the intact state and the second state can be the blown state). If the fuse is in the first state, the control circuit responds to an indication of the standby mode of the standby signal by continuously enabling the driver during the standby mode. On the other hand, if the is in the second state, the control circuit enables the driver only at an indication of an end of the standby mode of the standby signal and only for a certain period of time.

In this precharge circuit, the driver need not be a "long L" driver and instead can be a driver of any length. During the standby mode, if a bit line is short circuited to the word line, the precharge circuit does not drive up the bit lines until the very end of the standby mode. Thus, the bit lines are nevertheless charged up to the correct standby voltage but are not continuously driven during the entire standby mode so as to limit current draw of the short circuit.

DETAILED DESCRIPTION OF THE INVENTION

Figure 2:
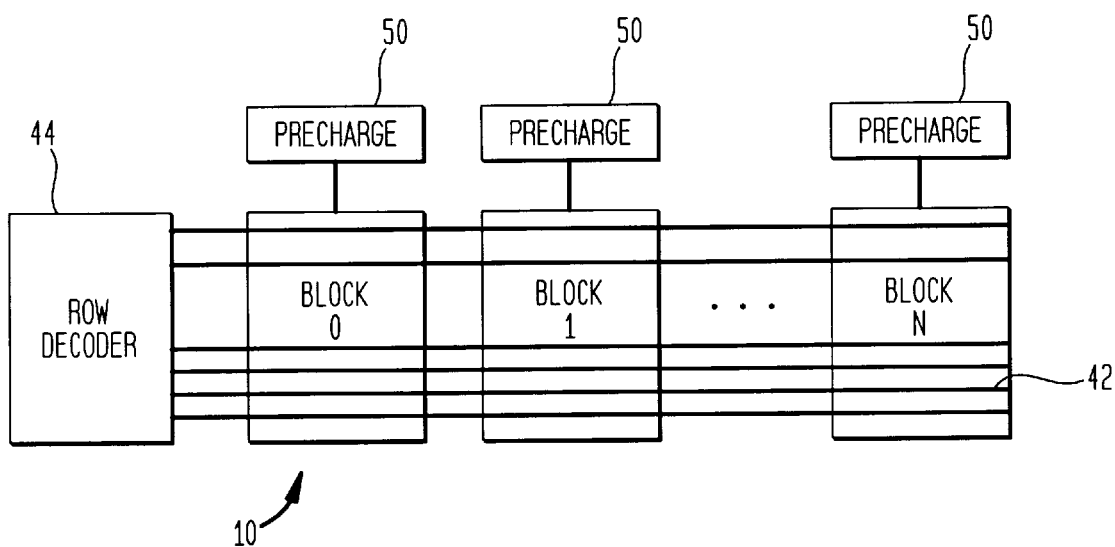
FIG. 2 shows a conventional block layout of the memory arrays.
Figure 3:
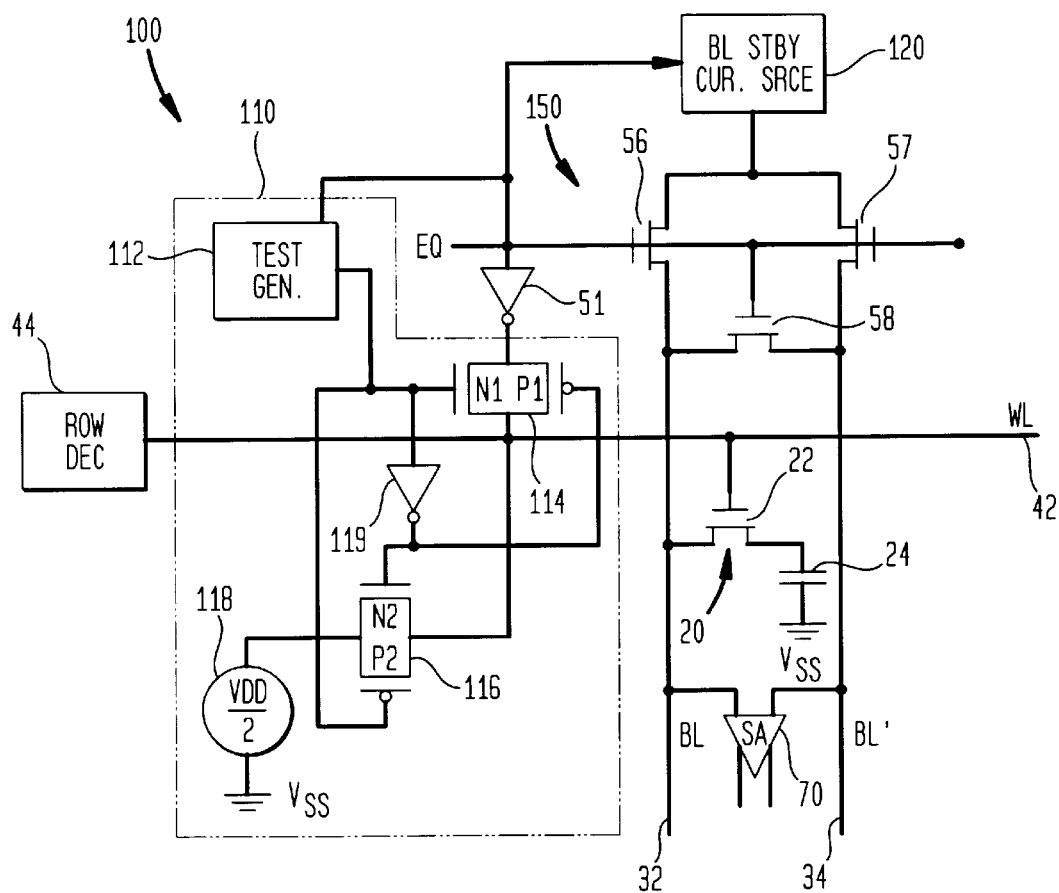
FIG. 3 shows a DRAM with precharge circuit and test circuit according to an embodiment of the present invention.

FIG. 3 shows a DRAM 100 according to the present invention. The memory array of the DRAM 100 may take the form shown in FIG. 2, where the columns of cells are divided into multiple blocks and a precharge circuit 150 is provided for each block.

As before, a row decoder 44 is provided which decodes a row address of a cell, such as the cell 20, and activates an appropriate addressed word line, such as word line 42. A column decoder (not shown) decodes a column address and activates an appropriate pair of bit lines of the column of the cell, such as the bit line 32 and complimentary bit line 34 connected to cell 20. As shown, a value read out of the cell 0 onto bit line pair 32, 34 is amplified by sense amplifier 70 for output.

A precharge circuit 150 is provided which responds to the standby mode signal EQ. As before, the signal EQ, when set to the high voltage level $V_{DD}$ causes inverter 51 to drive the word lines, such as word line to the low voltage level $V_{SS}$. (As described below, the test circuit 110 is an optional circuit. When present, during "normal" operation, the test signal generator 112 outputs a signal for enabling pass gate 14 and disabling pass gate 116). The high voltage level $V_{DD}$ EQ signal furthermore turns on NMOSFETs 56, 57 and 58 thereby charging the bit line pairs, such as bit line pairs 32 and 34, to the standby mode voltage level of $V_{DD}/2$, i.e., one half of the high voltage level $V_{DD}$.

The current for charging the bit line pairs 32, 34 to the standby voltage level of $V_{DD}/2$ is supplied by bit line standby current source 120. The bit line standby current source 120 is characterized as including a driver and a control circuit. The control circuit outputs an enabling signal for enabling the driver to drive the bit lines. However, the control circuit varies the enable signal so that the driver varies the drive it applies to the bit lines.

Figure 1:
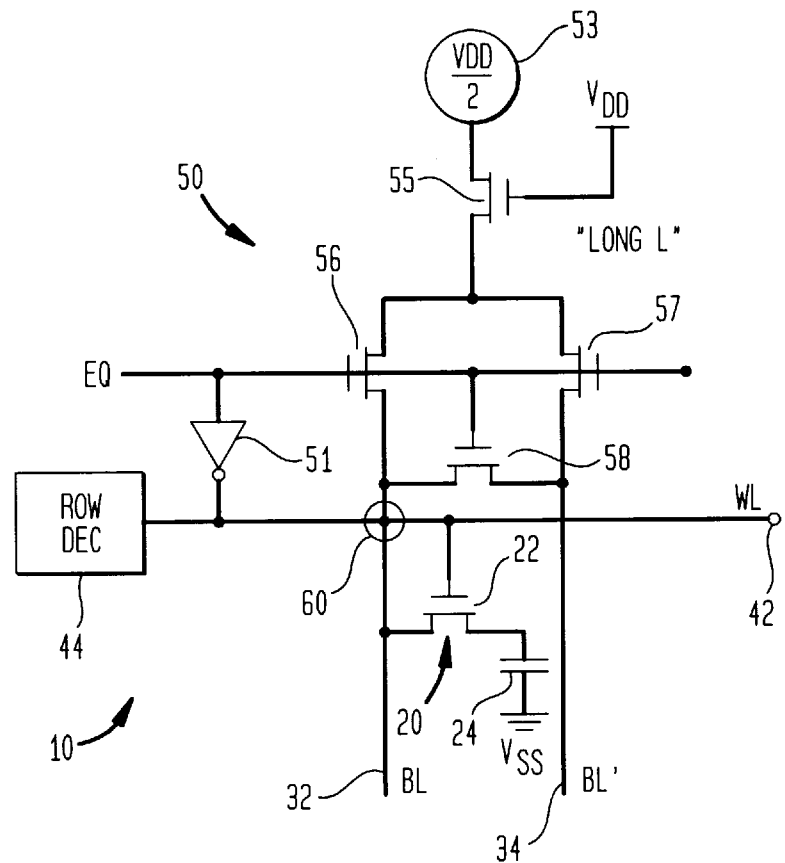
FIG. 1 shows a conventional DRAM with precharge circuit.
Figure 4:
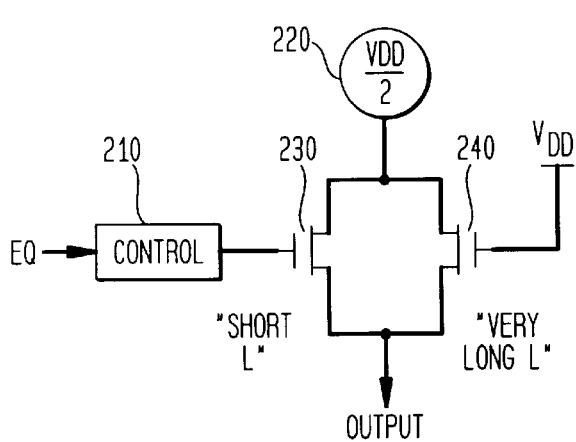
FIG. 4 shows a bit line standby mode current source according to a first embodiment of the present invention.

FIG. 4 shows a first embodiment of the bit line standby current source 120. As shown, two NMOSFETs 240 and 230 save their sources connected to a voltage source 220. The voltage source 220 supplies a voltage of $V_{DD}/2$ The drains of the NMOSFETs 230 and 240 serve as the output of the standby bit line current source 120 and both drains are connected to the sources of NMOSFETs 56 and 57 of FIG. 1. The NMOSFET 240 has a very long channel length L, preferably longer than normally provided in the long L NMOSFET 55 (FIG. 1) of the conventional DRAM 10 (FIG. 1). In contrast, the NMOSFET 230 is a short channel length NMOSFET, preferably substantially shorter than normally provided in the long L NMOSFET 55 (FIG. 1). The gate of the very long L NMOSFET 240 is permanently connected to the high voltage power supply bus. The gate of the short L NMOSFET 230 is connected to a control circuit 210 which also receives the standby mode signal EQ.

When standby mode is initiated, the control circuit 210 enables the short L NMOSFET 230.

The short L NMOSFET 230 quickly drives up the voltage of the bit line pairs, including bit line pairs 32, 34, to $V_{DD}/2$ or a voltage near $V_{DD}/2$. This is possible because the short L NMOSFET 230 has a short channel length, and therefore has a lower series resistance. The control circuit 210 only enables the short L NMOSFET for a certain period of time at the initiation of standby mode and then disables the short L NMOSFET 230. (For example, the control circuit 210 can be implemented with a rising edge detector connected to a monostable or one-shot pulse generator, that, together, generate a fixed length enabling pulse in response to detecting the rising edge of the voltage of the standby signal EQ). This is because the short L NMOSFET has a very high current driving capacity that could consume a very high current if one of the bit lines 32 or 34 that it drives is short circuited to one of the word lines 42. Instead, the very long L NMOSFET 240 continues to drive the bit lines 32 and 34 during the remainder of standby mode. Note that because very long L NMOSFET 240 has a very long channel, the current draw of a short circuit during standby mode can be reduced far below 75 μA per short circuit. Nevertheless, the short L NMOSPET 230 ensures that the bit lines are charged up to the standby voltage level of $V_{DD}/2$ very quickly so that the very long L NMOSFET 240 does not impact the minimum duration that the DRAM 100 must remain in standby mode before initiating an access mode.

Figure 5:
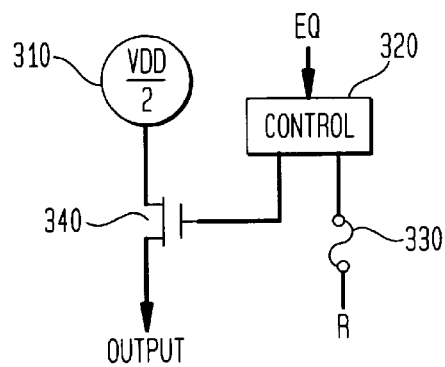
FIG. 5 shows a bit line standby mode current source according to a second embodiment of the present invention.

FIG. 5 shows an alternative bit line standby current source 120. As shown, a standby voltage source 310 is connected to the source of an NMOSFET 340. The drain of NMOSFET 340 serves as the output of the bit line standby current source 120 and is connected to the sources of NMOSFETS 56 and 57 of FIG. 1. The gate of NMOSFET 340 is connected to a control circuit 320. The control circuit 320 is also selectively connected to a reference voltage R (such as $V_{SS}$ or $V_{DD}$) via a fuse 330.

The NMOSFET 340 need not have any particular channel length for purposes of limiting the current draw of the bit lines 32,34 to which it is connected. (The channel length of NMOSFET 340 might be set to achieve some other desirable result such as quick response time, small area, etc.) Rather, the fuse 330 is blown during a post fabrication test if a bit line to word line short circuit is detected in any bit line driven by the standby bit line current source 120 during standby mode. The control circuit 320 determines whether or not the fuse 330 is blown (i.e., whether or not a bit line to word line short circuit is present in the bit line pairs driven by the bit line standby current source 120). If the fuse 330 is intact (e.g., no short circuit), the control circuit 320 permanently supplies the high voltage level $V_{DD}$ to the gate of the NMOSFET 340 (at least during the entire standby mode period). However, if the fuse 330 is blown (e.g., short circuit present), the control circuit 320 only enables the NMOSFET 340 at the end of the standby mode and only for a fixed period of time. (The control circuit 320 can be implemented using two parallel signal paths that are alternately enabled by transfer gates depending on whether or not the fuse 330 is blown. The first path, which is enabled when the fuse 330 is intact, connects the high voltage supply bus to the gate of NMOSFET 340. The second path includes a falling edge detector receiving the signal EQ connected to a monostable, which, together output an enabling pulse of predetermined duration in response to detecting a falling edge of the signal EQ.)

Thus during operation, when standby mode is initiated, the control circuit 320 determines whether or not the fuse is blown. If the fuse is blown, the control circuit 320 disables the NMOSFET 340. Upon detecting the end of the standby mode, the control circuit 320 enables NMOSFET 340 for a certain time. This causes NMOSFET 340 to charge up the bit line pairs 32, 34, to which it is connected, to $V_{DD}/2$. Thus, the control circuit 320 prevents the NMOSFET 340 from supplying current during the entire duration of the standby mode period and only enables the NMOSFET to drive the bit lines 32 and 34 at the very end of the standby mode period. Generally speaking, such a manner of operation cannot be employed for every precharge circuit 150 connected to each block of the DRAM 100 as the time needed to drive the bit line pairs of every block in parallel would be too long. However, the number of defective columns is typically limited to two.

Thus, at most, two of the precharge circuits 150 would operate in this fashion. The charging time of the bit lines of only of the blocks is feasible (especially when as many as 64 blocks may be present) and does not drastically impact the operation speed of the DRAM 100.

Above, the control circuit 320 determines that a bit line 32 and 34 that it charges has short circuited to the word line 42 if the fuse 330 to which it is connected is blown. Of course, it is also possible to construct the control circuit 320 to reversely interpret the roles of the blown state and intact state of the fuse 330. That is, fuses 330 can be blown for each precharge circuit 150 connected to bit lines 32 and 34 free of a short circuit to word lines 42 and left intact for each precharge circuit 150 connected to a bit line 32 or 34 with a short circuit to a word line 42. The control circuit 320 would therefore initially disable the NMOSFET 340 during standby mode and only enable NMOSFET 340 at the end of standby mode if the fuse 330 was intact.

When the embodiment of FIG. 5 is employed, some circuitry must also be provided for identifying bit line to word line short circuits. Illustratively, the test circuit 110 of FIG. 3 can be used to detect which blocks contain bit line to word line short circuits (and therefore which fuses 330 to blow). Of course, if the embodiment of FIG. 4 is used, the test circuit 110 can be omitted.

The test circuit 110 includes a test signal generator 112, a first pass gate 114, a second pass gate 116, and inverter 119 and a voltage source 118 that generates a voltage of $V_{DD}/2$. The pass gate 114 is formed by NMOSFET N1 and PMOSFET P1 connected between the inverter 51 and the word line 42. The pass gate 11 is formed by NMOSFET N2 and PMOSFET P2 connected between the voltage source 118 and the word line 42. The gates of N1 and P2 receive a signal outputted from the test signal generator 12. This signal is also inverted by the inverter 119 and outputted to the gates of P2 and N1.

As may be appreciated, the test signal generator 112 can output a high voltage level $V_{DD}$ signal to turn on the pass gate 114 and to turn off the pass gate 116 thereby enabling the inverter 51 to drive the word line 42 and preventing the voltage source 118 from driving the word line 42. Likewise, the test signal generator 112 can output a low voltage level $V_{SS}$ signal to turn off the pass gate 114 and to turn on the pass gate 116 thereby enabling the voltage source 118 to drive the word line 42 and preventing the inverter 51 from driving the word line 42. Illustratively, one test signal generator 112 is provided for each word line and each test signal generator 112 has plural outputs, including one output corresponding to each block. Each output corresponding to a block preferably is connected to a corresponding pair of pass gates 114 and 116, provided for, and connected to, each word line 42.

In operation, the DRAM 100 is placed in a "normal standby" mode whereby each test signal generator 112 places each lock in standby mode in unison, one block at a time. That is, for a given block, the test signal generators 112 enable each pass gate 114, disable each pass gate 116, and supply a high voltage signal EQ to only the given block. During the normal standby mode, the current draw or flow of the DRAM 100 is measured for each block. Next, the DRAM 100 is placed in a test mode, e.g., by supplying an externally originating test mode signal (not shown) to each test signal generator 112. In response, each test signal generator 112 disables the pass gate 114 and enables the pass gate 116, while still supplying a high voltage level signal EQ, in each tested block, in unison. This causes he voltage source 118 to drive the word line 42 up to $V_{DD}/2$, the same voltage applied to the bit lines 32, 34 by the bit line standby current source 120. The current draw or flow of the DRAM 100 is then measured. If a bit line to word line short circuit exists, then by driving the word line to the same voltage as the bit lines, the measured current draw when testing a block with such a short circuit will noticeably drop (because the voltage on both sides of the short circuit will be the same, thereby removing any current draw or flow due to the short circuit). After isolating which blocks contain word line to bit line short circuits (if any), the fuses 330 (FIG. 5) of the bit line standby current sources 120 that drive such blocks during standby mode are blown.

The above discussion is intended to be merely illustrative of the invention. Those having ordinary skill in the art may devise numerous alternative embodiments without departing from the spirit and scope of the following claims.

The claimed invention is:

1. A semiconductor memory comprising:
   a precharge circuit operable during a standby mode to drive one or more word lines of a memory array to a low voltage level and one or more bit lines of said memory array to a standby voltage level, said precharge circuit comprising:
   a first current limiting driver for driving said one or more bit lines to said standby voltage level,
   a second driver for driving said one or more bit lines to said standby voltage level, said second driver having a greater switching speed, and a higher current driving capacity, than said first current limiting driver, and
   a control circuit connected to a control input of said second driver and receiving standby signal, for enabling said second driver for a certain period of time in response to detecting an indication of a beginning of said standby mode of said standby signal.

2. A semiconductor memory comprising:
   a precharge circuit operable during a standby mode to drive one or more word lines of a memory array to a low voltage level and one or more bit lines of said memory array to a standby voltage level, said precharge circuit comprising:
   a driver for driving said one or more of bit lines to said standby voltage level,
   a control circuit connected to a control input of said driver and receiving a standby signal, and
   a fuse connected to said control circuit, said fuse being in either a first state or a second state corresponding to whether or not said fuse is blown,
   wherein if said fuse is in a first state, said control circuit responds to an indication of said standby mode of said standby signal by continuously enabling said driver during said standby mode, and wherein if said use is in a second state, said control circuit enables said driver only at an indication of an end of said standby mode of said standby signal and only for a certain period of time.

3. The semiconductor memory circuit of claim 2 further comprising:
   a voltage for applying said standby voltage to said one or more word lines during a test mode,
   a test signal generator for causing said precharge circuit to apply a low voltage to said one or more word lines in a normal standby mode and for causing said voltage generator to apply said standby voltage to said one or more word lines, while said precharge circuit applies said standby voltage to said bit lines during a test mode, and
   a measure current draw during said test mode and said standby mode.

4. The semiconductor memory circuit of claim 3 further comprising:
   a first pass gate connected between said voltage generator and one of said one or more word lines, and
   a second pass gate connected between said precharge circuit and one of said one or more word lines,
   whereby said test signal generator enables said first pass gate and disables said second pass gate during said test mode and enables said second pass gate and disables said first pass gate during said normal standby mode.

5. A method for relating current in a semiconductor memory circuit having plural bit lines and plural word lines that are subject to bit line to word line short circuit defects comprising the steps of:
   (a) measuring a current draw of said semiconductor memory circuit during a normal standby mode, during which a word line is driven to a low voltage and one or more bit lines are driven to a standby voltage,
   (b) connecting a standby mode voltage generator to one of said word lines during a test mode,
   (c) measuring a current draw of said semiconductor memory circuit during said test mode, during which said word line and said one or more bit lines are driven to said standby voltage, and
   (d) determining that said word line has short circuited to one of said bit lines in response to detecting more than a threshold difference in current flow during said normal mode and said test mode.

6. The method of claim 5 further comprising the step of:

(e) determining which fuses of said semiconductor memory circuit correspond to each of said bit lines determined to have short circuited to a word line, and (f) selectively blowing said fuses so as to place said each of said corresponding fuses in a first state and each of said other fuses in a second state, said first and second states corresponding to whether or not said fuse blown.

7. The method of claim 5 further comprising the step of repeating steps (a)–(e) for each separate group of bit lines of said semiconductor memory circuit precharged by a different precharge circuit.

8. The method of claim 5 further comprising the steps of:

(f) during a standby mode, continuously charging each bit line, connected to a precharge circuit with a fuse in said second state, to said standby voltage, and (g) during said standby mode charging each bit line, connected to a precharge circuit with fuse in said first state, to said standby voltage only at an end of said standby mode.

9. A semiconductor memory comprising:

a precharge circuit operable during a standby mode to drive one or more word lines of a memory array to a low voltage level and one or more bit lines of said memory array to a standby voltage level, said precharge circuit comprising:

a driver for driving said one or more of bit lines to said standby voltage level, and a control circuit connected to a control input of said driver and receiving a standby signal, for outputting a varying enable signal to said driver for varying the drive of said one or more bit lines by said driver.

10. The semiconductor memory of claim 9 wherein said control circuit varies said enable signal so that said driver varies he drive of said one or more bit lines in response to different operating modes.

* * * * *